United States Patent
Caruana et al.

(10) Patent No.: US 8,618,676 B2
(45) Date of Patent: Dec. 31, 2013

(54) METHOD OF ASSEMBLY OF A SEMICONDUCTOR PACKAGE FOR THE IMPROVEMENT OF THE ELECTRICAL TESTING YIELD ON THE PACKAGES SO OBTAINED

(75) Inventors: Robert Caruana, Zabbar (MT); Adrian-Michael Borg, Birkirkara (MT); Joseph Gauci, Naxxar (MT)

(73) Assignee: STMicroelectronics (Malta) Ltd., Kirkop (MT)

( * ) Notice: Subject to any disclaimer, the term of this patent is extended or adjusted under 35 U.S.C. 154(b) by 945 days.

(21) Appl. No.: 12/261,841

(22) Filed: Oct. 30, 2008

(65) Prior Publication Data

US 2010/0109150 A1 May 6, 2010

(51) Int. Cl.
*H01L 23/52* (2006.01)
*H01L 23/48* (2006.01)
*H01L 29/40* (2006.01)

(52) U.S. Cl.
USPC ............... 257/781; 257/E23.069; 257/778; 257/780; 438/614

(58) Field of Classification Search
USPC .......... 257/E21.509, E23.069, 693, 738, 762, 257/769, 778, 779, 781, 780; 438/106, 614; 228/180.22
See application file for complete search history.

(56) References Cited

U.S. PATENT DOCUMENTS

| | | | | |
|---|---|---|---|---|
| 5,274,913 A | * | 1/1994 | Grebe et al. | 29/840 |
| 5,304,257 A | | 4/1994 | Pearlstein et al. | |
| 5,371,328 A | * | 12/1994 | Gutierrez et al. | 174/261 |
| 5,615,825 A | * | 4/1997 | Bobbio et al. | 228/206 |
| 5,761,048 A | * | 6/1998 | Trabucco | 361/760 |
| 6,013,381 A | * | 1/2000 | Bobbio et al. | 428/628 |
| 6,059,172 A | * | 5/2000 | Chapman et al. | 228/180.22 |
| 6,104,087 A | * | 8/2000 | DiStefano et al. | 257/696 |
| 6,265,776 B1 | * | 7/2001 | Gilleo | 257/738 |
| 6,283,359 B1 | * | 9/2001 | Brofman et al. | 228/180.22 |
| 6,324,754 B1 | * | 12/2001 | DiStefano et al. | 29/840 |
| 6,337,445 B1 | * | 1/2002 | Abbott et al. | 174/260 |
| 6,723,627 B1 | * | 4/2004 | Kariyazaki et al. | 438/612 |
| 6,756,680 B2 | * | 6/2004 | Jimarez et al. | 257/772 |
| 6,781,065 B1 | * | 8/2004 | Palmteer | 174/260 |
| 6,863,718 B2 | | 3/2005 | Lamborn et al. | |
| 6,872,465 B2 | * | 3/2005 | Soga et al. | 428/570 |
| 6,906,417 B2 | * | 6/2005 | Jiang et al. | 257/738 |
| 6,906,427 B2 | * | 6/2005 | Tanaka et al. | 257/778 |
| 6,955,982 B2 | * | 10/2005 | Jimarez et al. | 438/616 |
| 6,972,249 B2 | * | 12/2005 | Akram et al. | 438/613 |
| 7,045,894 B2 | * | 5/2006 | Yamaguchi et al. | 257/738 |

(Continued)

OTHER PUBLICATIONS

Shogrin et al., "The Effects of Acid Passivation, Tricresyl Phosphate Presoak, and UV/Ozone Treatment on the Tribology of Perfluoropolyether-Lubricated 440C Stainless Steel Couples", NASA/TM 2001-210947, Jun. 2001, 16 pages.

*Primary Examiner* — Chris Chu
(74) *Attorney, Agent, or Firm* — Seed IP Law Group PLLC

(57) ABSTRACT

A method of assembly of a semiconductor package includes treating the electrical contacts thereof by the application on the electrical contacts of a chemical composition comprising at least one ionic polar surfactant. A semiconductor package has a coating on the electrical contacts thereof, the coating comprising at least one ionic polar surfactant. A device includes a semiconductor package with electrical contacts on a circuit board, the electrical contacts having a coating that includes an ionic surfactant.

22 Claims, 4 Drawing Sheets

(56) References Cited

U.S. PATENT DOCUMENTS

| | | | |
|---|---|---|---|
| 7,109,061 B2 * | 9/2006 | Crane et al. | 438/118 |
| 7,169,332 B2 * | 1/2007 | Oh et al. | 252/512 |
| 7,183,648 B2 * | 2/2007 | Ramanathan et al. | 257/738 |
| 7,629,202 B2 * | 12/2009 | Weiss et al. | 438/119 |
| 7,700,476 B2 * | 4/2010 | Suh et al. | 438/615 |
| 7,782,624 B2 * | 8/2010 | Fujii | 361/720 |

* cited by examiner

METHOD OF ASSEMBLY OF A SEMICONDUCTOR PACKAGE FOR THE IMPROVEMENT OF THE ELECTRICAL TESTING YIELD ON THE PACKAGES SO OBTAINED

BACKGROUND

1. Technical Field

The present invention generally relates to the technical field of semiconductor package assembly.

More in particular, the present invention relates to a method of assembly of a semiconductor package comprising the step of treating the electrical contacts thereof for the improvement of the electrical test yield on the packages so obtained, with particular reference to ball grid array (BGA) packages.

The following description is made with reference to the specific technical field of BGA semiconductor packages for the sole purpose of simplifying the disclosure of the invention. However, the invention is applicable to all types of semiconductor packages, for example lead frame-based, pin-based, flat contact packages, etc.

2. Description of the Related Art

In the past few years, ball grid array (BGA) semiconductor packages have enjoyed widespread use and success in the industry thanks to the many advantages they offer compared to the more traditional lead frame packages. The most obvious advantage they confer is their ability to host an increased number of interconnections within small dimensions whilst maintaining satisfactory ease of use and safety levels. This feature enables them to be used successfully in many high performance applications such as microprocessors, controllers, memories and chip sets, which have high density interconnection packages.

The basic architecture of a typical BGA package comprises a solder ball base, providing external electrical interconnection with the rest of the system, underlying a substrate, usually made of an inorganic material, e.g. silicon, resin or glass, which in turn underlies a die, as shown for instance in FIGS. 1 and 2, where the BGA package is globally indicated with 1.

The solder balls 2, which functionally replace the leads used in lead frame or pin grid array (PGA) packages, are attached to metal pads 4 at the bottom of the substrate 3 and their composition may include, for example, copper, tin, silver, lead, or bismuth. Typically, a 10×10 mm BGA package will contain up to 300 solder balls.

Solder balls are mechanically tougher than leads, thus enabling the package to better tolerate rough handling. Also, ball arrays allow for slightly imperfect placement during assembly, as they are, to a certain extent, capable of self-alignment to their attachment sites.

In the assembly of BGA packages, solder balls are typically placed on metal pads 4 (integrated in the substrate 3) atop a layer of flux liquid and passed for reflow. The solder ball 2 attaches to the metal pad as it melts and re-solidifies, as shown for instance in FIG. 3.

In this process, which is standard, solder paste, a sticky mixture of flux and solder, is first applied to all the metal pads 4 with a gold-plated stainless steel tooling.

The substrates 3 then enter a pre-heat zone, where the temperature of the substrates and all their components is gradually, uniformly raised. The substrates then enter a zone where the temperature is high enough to melt the solder particles in the solder paste, bonding the solder to the metal pads 4 on the substrates. The surface tension of the molten solder helps keep the solder in place. There are a number of techniques that can be used for reflowing solder: infrared lamps, hot gas, fluorocarbon, nitrogen, to name a few.

After soldering, the substrates 3 are washed to remove flux residue and any stray solder balls that could short out closely spaced metal pads. Water soluble fluxes are removed with deionized (DI) water and detergent, followed by a rinsing step with DI water, and an air blast to quickly remove residual water.

Finally, the substrates are visually inspected for missing or misaligned solder balls and solder bridging. If needed, they are sent to a rework station where a human operator corrects any errors. The substrates, inclusive of the reworked substrates, are then sent to the testing stations to verify that they work correctly.

The cleaning step is important, as poor cleaning can result in non-conductive residues on the ball, which in turn would hinder the electrical conductivity of the device and hence give poor yield during electrical function tests on the device.

Solder balls, particularly those in tin-rich alloys, are susceptible to oxidation or contamination after cleaning. This occurs naturally upon contact with atmospheric oxygen and water vapor and also upon handling and stacking, which expose the solder balls to accumulation of foreign material.

This degrades the solder finish and hence leads to a loss in the electrical testing yield, particularly in high temperature and/or high humidity treatments such as mold compound curing or storing at atmospheric conditions.

By "electrical testing yield" is meant the proportion of devices from a production lot, following integrated circuit (IC) assembly, found to work properly upon electrical testing.

Electrical testing generally consists of a method of IC testing through an electronic tester whereby a probe is pressed against the solder balls of the IC. Bad chips are segregated for re-test before scrapping. The outcome of electrical testing depends on the quality of the solder ball to test pin conduction. Numerous electrical tests are dependent on precise resistance, current flows and time delays. Hence if an IC is fully functional but cannot communicate perfectly with the testing socket it will result in a false failure. These devices may be recovered by re-testing them after cleaning the socket or device contacts.

Various cleaning chemicals are sometimes employed to improve the cleaning of the solder balls but, even when effective, the clean solder surface then remains unprotected and its quality degrades over time and with use.

Different solder alloys, based on a tin-rich metal composition, can also be used for different applications, based on different requirements. The composition of the solder alloy, in fact, affects the ball shear force, that is, the strength of the adhesion of the balls to their respective metal pads.

Another characteristic being affected by the composition of the solder alloy is the melting point of the solder. A standard tin/lead (63%/37% (w/w)) composition, for example, melts at about 183° C. while a pure tin (Pb-free) composition melts at 232° C. This requires higher temperatures and longer time to solder, and subjects the materials to higher stress, due to the higher temperatures. A typical lead-free solder incorporates silver, copper, and other metals in the range of 1-4%, which causes it to melt at around 218° C. This is advantageous in terms of energy and time, and, additionally, improves joint strength and reliability.

Other parameters affected by the solder alloy composition are the compatibility with PCB solder pastes, and the resistance shown in the drop-test.

The drop-test is a test mostly used in portable electronics, such as mobile phones, where a complete assembled set is dropped several times in a 'bumping' machine to mimic the phone being dropped. These mechanical shocks test the joint strength between the IC and the board, and the ability of the device to maintain a reliable electrical path.

However, some alloys, which incorporate elements to minimize surface insulation, tend to be expensive and less consistent in performance due to the very low concentrations of the metals incorporated (e.g. germanium), typically at less than 100 ppm. An example is SnAg with 50 ppm of Ge.

Yield loss at the electrical testing stage is not cost-efficient, as the final product at this stage of assembly has high added value and materials. Poor yield will require the failed devices to be re-tested perhaps several times, to recover the good devices that only failed due to poor contact between solder ball and test pin. This results in poor efficiency of the test equipment utilization, mainly due to longer cycle times (that is, the time taken to test the batch), a higher risk of mixing up good and faulty items, and excessive handling.

Ideally, in fact, good or bad devices are immediately identified from a first and only test. Re-testing to recover good devices which were falsely found bad due to poor chip to socket contact, represents a waste of time. Also, in an IC production facility, several different Si chips may be packaged in physically identical ICs. As re-testing generates an increasing number of small sub-lots, the probability of different devices getting mixed up increases with the number of re-testing cycles required.

This directly implies that an improved first pass yield (first test attempt) would result in considerable financial and qualitative gains.

To overcome the problem of solder ball contamination, chemical methods of passivation or pore blocking of the metal surface have been tried, such as the ones using chromic and phosphoric acids. However, these chemicals are ineffective, since the protective oxide layer generated is relatively thick and has poor electrical conductivity.

U.S. Pat. No. 6,863,718 (Lamborn et al.) discloses the use, as a coating for metal pigment particles, of a product resulting from the reaction between an organic phosphonic acid with an amine having at least one organic group containing at least six carbon atoms, to inhibit their reactivity to water.

Shogrin et al. (NASA/TM, 2001-210947, 1-11) describe the passivation of stainless steel surfaces, more in particular lubricated contacts, with one of four techniques: high and low temperature chromic acid bath, a tricresyl phosphate (TCP) soak, or UV/Ozone treatment for 15 minutes. The lubricant of the contacts is perfluoropolyethers (PFPEs). It is concluded that the PFPE lubricated lifetime (Krytox 16256) of sliding 440C stainless steel couples does not statistically change as a result of the various passivation techniques. Also, PFPE lubricated lifetime (Brayco 815Z) of 440C stainless steel couples in boundary lubricated rolling contact do not statistically change as a result of the TCP passivation technique.

U.S. Pat. No. 5,304,257 describes a process for preparing a corrosion-resistant trivalent chromium coating on aluminum and aluminum-alloy substrates which comprises treating the substrates with an acidic aqueous solution free of hexavalent chromium and contains from about 0.2 to 3.0 grams per liter of a water soluble trivalent chromium compound, from about 0.05 to 1.5 grams per liter of a water soluble fluoride compound and a sufficient amount of an alkaline reagent to maintain the aqueous solution at a pH ranging from about 4.0 to 5.5 to form the trivalent-chromium coating on said aluminum substrates.

The above examples give protection but poor conductivity, a condition which is, of course, undesirable in electrical testing. Moreover, the traditional method of only washing with hot DI achieves the cleaning of the surface but not the protection of the surface from the eventual contamination and oxidation.

The need thus arises of providing a cheap, simple and reliable method of assembly of a semiconductor package comprising the step of treating the electrical contacts thereof, in particular the solder balls of a ball grid array (BGA) semiconductor package, to obtain an increase in electrical testing yield of the semiconductor packages thus assembled by preventing false electrical failures due to poor contacting between device and test socket.

BRIEF SUMMARY

One embodiment is a method of assembly of a semiconductor package comprising the step of treating the electrical contacts thereof by the application on the electrical contacts of a chemical composition comprising at least one ionic polar surfactant.

Preferably, the chemical composition has a pH of 6 or below, preferably about 4.

Preferably, the chemical composition further includes a pH stabilizer, preferably free phosphonic acid.

Advantageously, the chemical composition may include other, conventional, surfactants, such as polyglycol ether and/or octadecenol.

An ionic surfactant is defined as a molecule having both a non-polar hydrophobic group and an ionic inorganic hydrophilic group.

Advantageously, the chemical composition forms a coating that is both protective and electrically conductive.

Preferably, the electrical contacts are solder balls and the semiconductor package is a BGA package.

Preferably, the surfactant of the chemical composition of the treatment is an anionic surfactant chosen in the group consisting of: alkyl sulphonates, alkyl phosphonates and N-trimethylated amino acids, and mixtures thereof.

Preferably, the surfactant of the chemical composition is an alkyl phosphonate.

Preferably, the surfactant of the chemical composition comprises a hydrophobic carbon chain 5 to 15 carbon atoms long, preferably 7 to 12 carbon atoms long, even more preferably 10 carbon atoms long Preferably, the method involves the formation of a coating on the solder balls of a thickness of about 1 to 3 molecules of the surfactant. This corresponds to a thickness of 0.005 to 0.1 micrometers.

Preferably, the method involves the formation of a coating comprising a concentration of the surfactant in the chemical composition of 50 to 95%, preferably 70 to 90%, preferably 80% on a weight to weight (w/w) basis.

According to one embodiment, the chemical composition of the treatment is applied during the cleaning step of the assembly process of the semiconductor package. Advantageously, the chemical composition is prepared by mixing it in an aqueous solution, preferably in the cleaning water.

The chemical composition may, for example and in the case of a BGA package assembly, be mixed into the cleaning deionized (DI) water, at a concentration in the cleaning water of 0.1 to 1%, preferably of 0.25 to 0.5%, preferably of 0.35% (w/v), and at a temperature of 20 to 60° C., preferably 30 to 50° C., most preferably 40° C. just after the ball attach process, and the BGA package rinsed with pure DI water just after cleaning. The exact process sequence can be adjusted to suit the cleaning equipment setup already being used.

Advantageously, the chemical composition is easily applied, environmentally friendly, resistant to degradation up to 200° C. and inexpensive.

One embodiment refers to the use of a chemical composition for the treatment of metal contacts of a semiconductor package, preferably BGA solder balls, the chemical composition comprising at least one ionic polar surfactant.

Preferably, the chemical composition has a pH of 6 or below, preferably about 4.

Preferably, the chemical composition further includes a pH stabilizer, preferably free phosphonic acid.

Advantageously, the chemical composition may include other surfactants, such as polyglycol ether and/or octadecenol.

Advantageously, the chemical composition forms a coating that is protective and electrically conductive.

Preferably, the surfactant of the chemical composition is chosen in the group consisting of: alkyl sulphonates, alkyl phosphonates and N-trimethylated amino acids, and mixtures thereof, preferably alkyl phosphonates.

Preferably, the surfactant of the chemical composition comprises a hydrophobic carbon chain 5 to 15 carbon atoms long, preferably 7 to 12 carbon atoms long, even more preferably 10 carbon atoms long.

Preferably, the chemical composition forms a coating of a thickness of about 1 to 3 molecules of the surfactant. This corresponds to a thickness of 0.005 to 0.1 micrometers.

Preferably, the chemical composition is used at a concentration of surfactant in the chemical composition of 50 to 95%, preferably 70 to 90%, preferably 80% (w/w).

Preferably, the chemical composition is used in the form of an aqueous solution, preferably mixed into the cleaning water of the assembly process.

Preferably, the chemical composition is used at a concentration in the cleaning water of 0.1 to 1%, preferably of 0.25 to 0.5%, preferably of 0.35% (w/v), and at a temperature of 20 and 60° C., preferably 30 to 50° C., most preferably 40° C.

Advantageously, the chemical composition is easily applied, environmentally friendly, resistant to degradation even up to 200° C., and inexpensive.

Finally, one embodiment refers to a semiconductor package, preferably a ball grid array package, having a coating on the electrical contacts, preferably on the solder balls, thereof, the coating comprising at least one ionic polar surfactant.

Preferably the surfactant of the coating is chosen in the group comprising alkyl sulphonates, alkyl phosphonates and N-trimethylated amino acids, and mixtures thereof, preferably alkyl phosphonates.

Preferably, the surfactant of the chemical composition comprises a hydrophobic carbon chain 5 to 15 carbon atoms long, preferably 7 to 12 carbon atoms long, even more preferably 10 carbon atoms long.

Preferably, the coating on the solder balls is of a thickness of about 1 to 3 molecules of surfactant, corresponding to a thickness of 0.005 to 0.1 micrometers.

Preferably, the coating has a concentration of surfactant in the coating of 50 to 95%, preferably 70 to 90%, preferably 80% (w/w). Advantageously, the coating is protective and electrically conductive.

The characteristics and advantages of the method and of the chemical composition will be apparent from the following description or aspects thereof given by way of indicative and non-limiting examples with reference to the annexed drawings.

DETAILED DESCRIPTION

Figure 4:
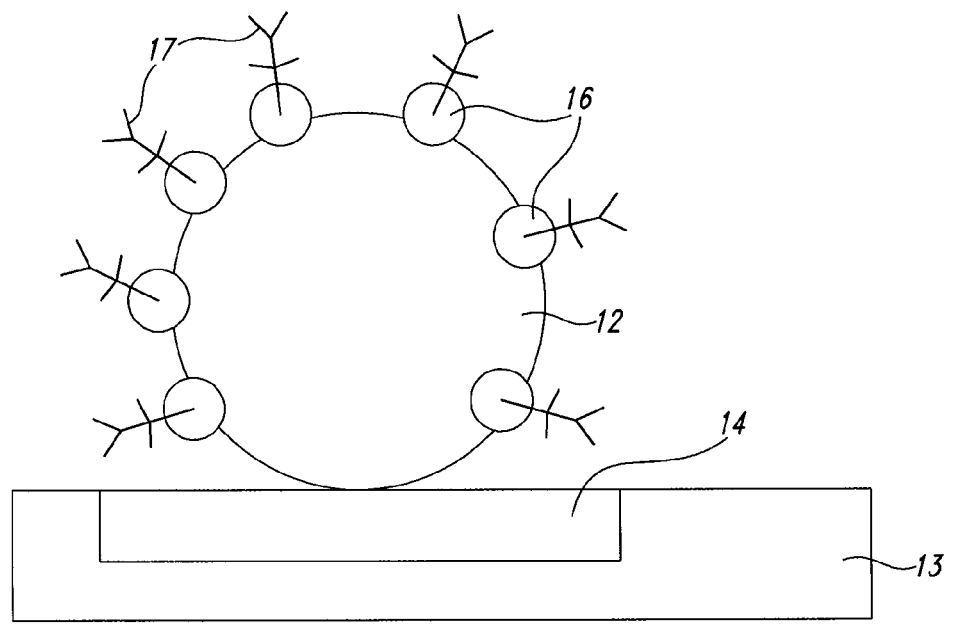
FIG. 4 shows a schematic representation of the mechanism of action of the chemical composition of a method of one embodiment.

As already indicated above, and as shown in FIG. 4, the basic architecture of a typical BGA package comprises a substrate 13, usually made of an inorganic material, e.g. silicon, resin or glass, wherein a plurality of metal pads 14 are realized, being in contact with a plurality of solder balls 12. For simplicity of illustration, one solder ball 12 and a corresponding metal pad 14 are shown in such figure.

In particular, the solder balls are attached to the bottom of the substrate 13 and their chemical composition may include, for example, copper, tin, silver, lead, or bismuth.

Figure 1:
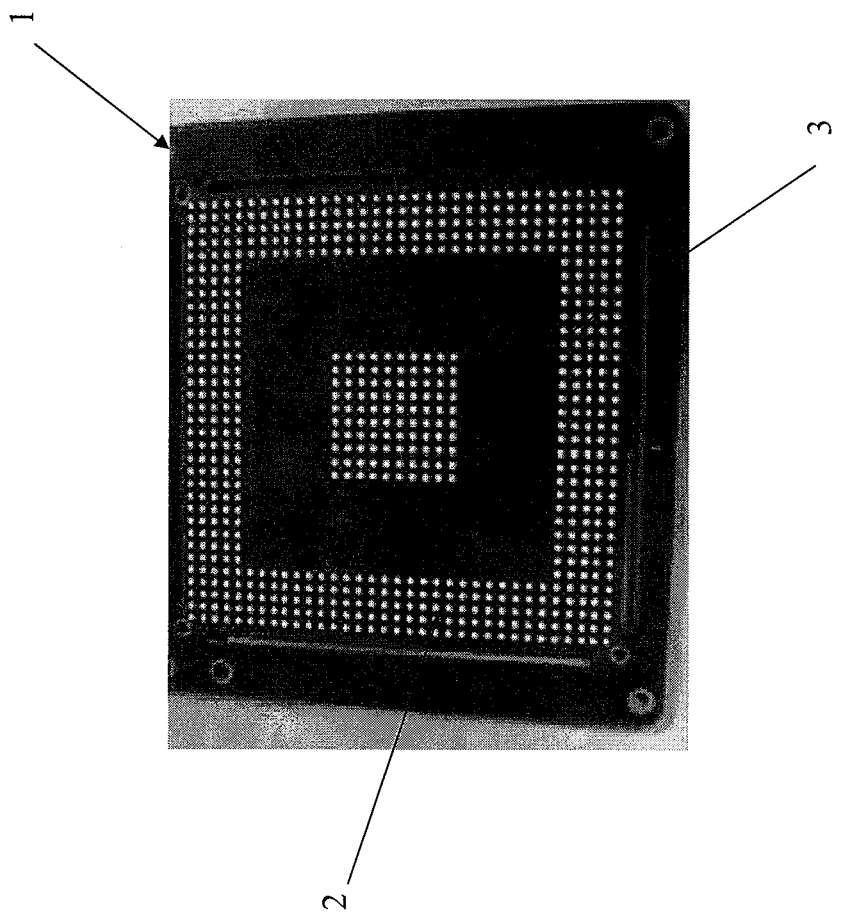
FIG. 1 shows a photograph of the underside of a typical BGA assembly, according to the prior art.
Figure 2:
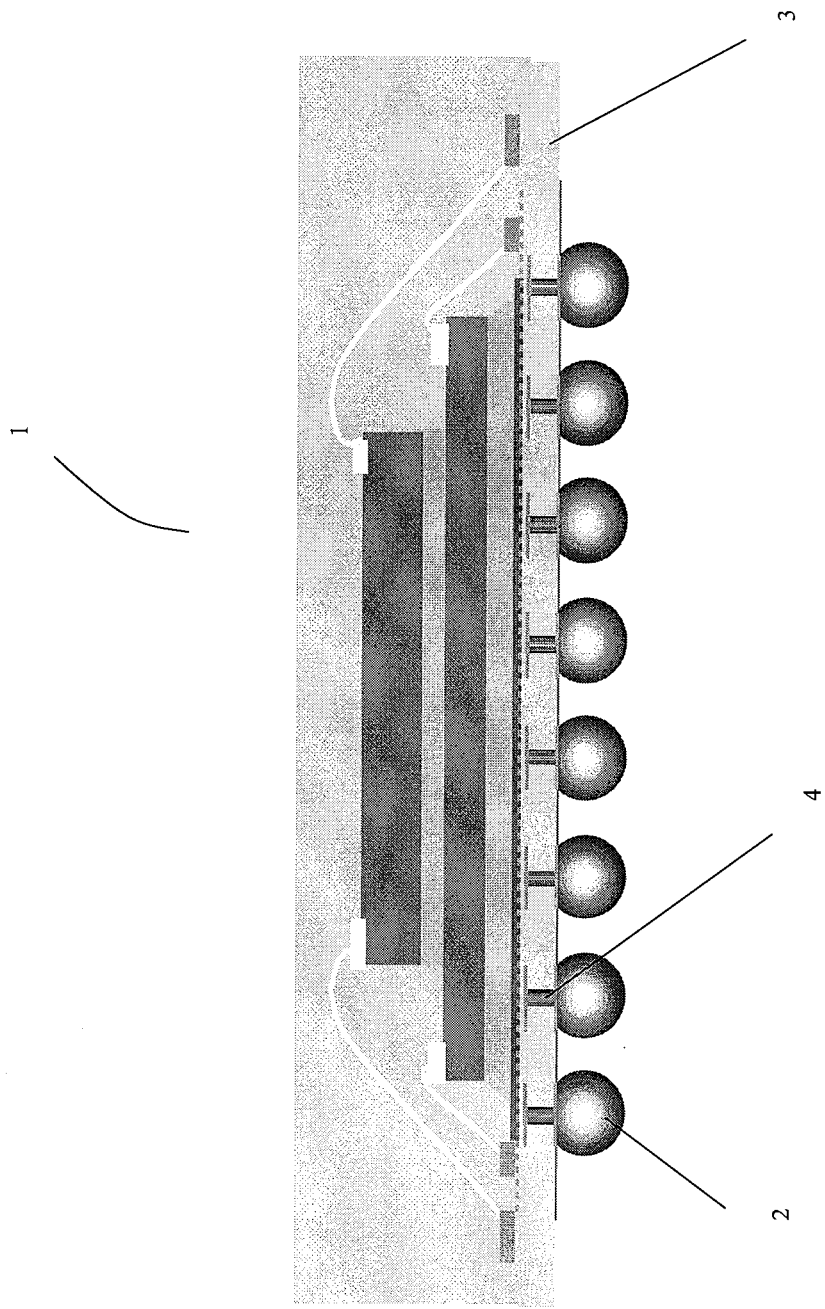
FIG. 2 shows a schematic representation of a typical BGA package, according to the prior art.
Figure 3:
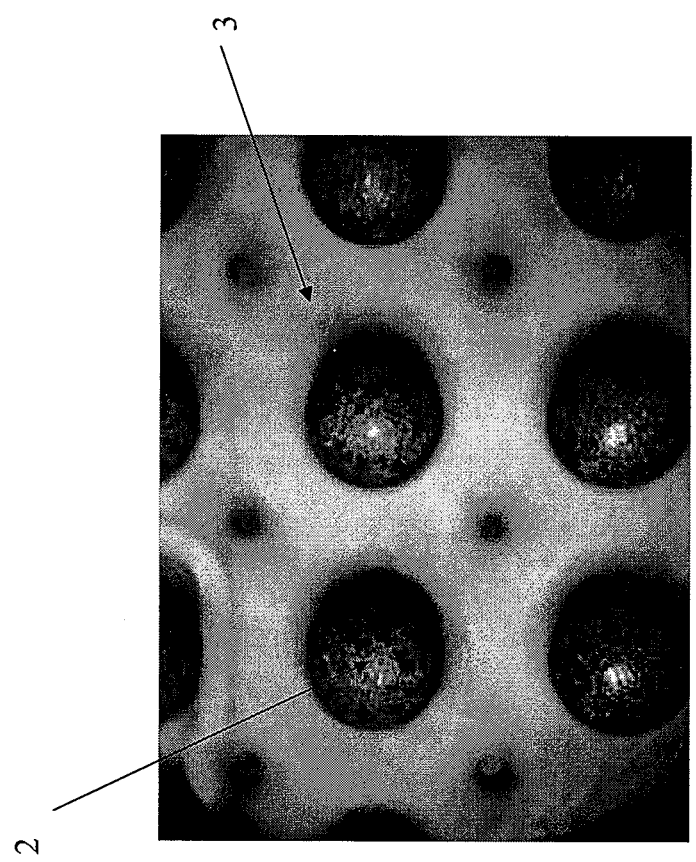
FIG. 3 shows a photograph of a step of the assembly process of a BGA according to the prior art.

The method of assembly of BGA packages comprises a step of placing the solder balls on the metal pads atop a layer of flux liquid and a step of reflowing wherein the solder ball attaches to the metal pad as it melts and re-solidifies, as already indicated in the prior art section and shown for instance in FIG. 3.

The method also comprises a step of washing the printed circuit boards (PCB) so obtained to remove flux residue and any stray solder balls.

Advantageously, the proposed method of assembly of a semiconductor package further comprises the step of treating the electrical contacts thereof by the application on the electrical contacts of a chemical composition comprising at least one ionic polar surfactant.

Preferably, the chemical composition has a pH of 6 or below, preferably about 4.

Preferably, the chemical composition further includes a pH stabilizer, preferably free phosphonic acid.

Advantageously, the chemical composition may include other, conventional, surfactants, such as polyglycol ether and/or octadecenol.

An ionic surfactant is defined as a molecule having both a non-polar hydrophobic group and an ionic inorganic hydrophilic group.

Advantageously, the application on the electrical contacts of a chemical composition forms a protective and electrically conductive coating.

It has been found, in fact, that when a solder ball is treated in such way, the chemical composition adheres to the solder surface forming a coating and, at the same time, repels any foreign contaminants. Advantageously, such surfactant will remain intact as a coating on the solder ball surface after washing/drying and heating.

Without wishing to be bound by theory, it is thought that in such a composition, the molecule attaches by its polar end to the metal surface of the metal contact (e.g. tin) while the non-polar organic end is directed away from the metal surface. This way, the chemical composition readily adheres to the metal contact surface but presents a hydrophobic surface to the external environment.

In particular, the polar end 16 of the molecule of such a composition attaches to the metal surface of the metal pad (e.g. tin) while the non-polar organic end 17 is directed away from the metal surface.

Preferably, the electrical contacts are solder balls and the semiconductor package is a BGA package.

Preferably, the surfactant of the chemical composition of the coating of the treatment is an anionic surfactant and is chosen in the group consisting of: alkyl sulphonates, alkyl phosphonates and N-trimethylated amino acids, and mixtures thereof.

Preferably, the surfactant of the chemical composition is alkyl phosphonates.

Preferably, the surfactant of the chemical composition comprises a hydrophobic carbon chain 5 to 15 carbon atoms long, preferably 7 to 12 carbon atoms long, even more preferably 10 carbon atoms long.

The selection of the surfactant molecule is important. If the protective non-polar end is too large, the coating will not be sufficiently conductive. The same problem occurs if the polar end is not strong enough, i.e. if the surfactant is not polar enough.

Without wishing to be bound by theory, in fact, it is thought that the characterizing part of the surfactant molecule is the polar end, while the non-polar end is a simple organic alkyl chain e.g. —$CH_2$—$CH_2$—$CH_2$—$CH_2$—$CH_2$— etc. The surfactant preferably comprises a strong polar group, as those mentioned as examples above, and a relatively short organic chain usually 8 to 10 carbon atoms long. The alkyl phosphonate, in particular, has high affinity to Sn and the alkyl group is between 7 and 12 carbons long.

Preferably, the method involves the formation of a coating on the solder balls of a thickness of about 1 to 3 molecules of the surfactant. This corresponds to a thickness of 0.005 to 0.1 micrometers.

A thickness lower than such range would make the coating ineffective while a higher thickness would make the coating unstable and would be a waste of resources.

Preferably, the method involves the formation of a coating comprising a concentration of the surfactant in the chemical composition of 50 to 95%. preferably 70 to 90%, preferably 80% (w/w).

Lower concentrations, in fact, would increase the risk that protection is not achieved after the typical 10 second dip while higher concentrations would constitute an un-necessary waste of resources.

According to one embodiment, the chemical composition of the treatment is applied during the cleaning step of the assembly process of the semiconductor package. Advantageously, the chemical composition is prepared by mixing it in an aqueous solution, preferably in the cleaning water.

The chemical composition may, for example and in the case of a BGA package assembly, be mixed into the cleaning DI water, at a concentration in the cleaning water of 0.1 to 1%, preferably of 0.25 to 0.5%, preferably of 0.35% (w/w), and applied at a temperature of 20 to 60° C., preferably 30 to 50° C., most preferably 40° C., just after the ball attach process. The BGA package is rinsed with pure DI water just after cleaning. The exact process sequence can be adjusted to suit the cleaning equipment setup already being used.

Without wishing to be bound by theory, it is thought that, during the application of the cleaning water the chemical composition adheres to the metal solder ball through its hydrophilic ends forming a coating. Despite the subsequent rinsing step, the coating then remains attached to the surface of the solder ball, the hydrophobic ends being oriented towards the external environment and the water. This way, the rinsing water cannot wash away the chemical composition from the surface of the solder ball.

The benefits of the method of treatment are most effective on alloys that are prone to poor electrical yield such as pure tin, tin-silver and other lead free metal finishes.

Advantageously, the chemical composition is easily applied, environmentally friendly, resistant to degradation up to 200° C. and inexpensive.

One embodiment refers to the use of a chemical composition for the treatment of metal contacts of a semiconductor package, preferably BGA solder balls, the chemical composition comprising at least one ionic polar surfactant.

Preferably, the chemical composition has a pH of 6 or below, preferably about 4.

Preferably, the chemical composition further includes a pH stabilizer, preferably free phosphonic acid.

Advantageously, the chemical composition may include other, conventional, surfactants, such as polyglycol ether and/or octadecenol.

Advantageously, the chemical composition forms a coating on the solder ball that is protective and electrically conductive.

Preferably, the surfactant of the chemical composition is chosen in the group consisting of: alkyl sulphonates, alkyl phosphonates and N-trimethylated amino acids, and mixtures thereof, preferably alkyl phosphonates.

Preferably, the surfactant of the chemical composition comprises a hydrophobic carbon chain 5 to 15 carbon atoms long, preferably 7 to 12 carbon atoms long, even more preferably 10 carbon atoms long.

Preferably, the chemical composition forms a coating on the solder balls of a thickness of about 1 to 3 molecules of the surfactant. This corresponds to a thickness of 0.005 to 0.1 micrometers.

Preferably, the chemical composition is used at a concentration of surfactant in the chemical composition of 50 to 95%, preferably 70 to 90%, preferably 80% (w/w).

Preferably, the chemical composition of the method is used in the form of an aqueous solution, preferably the cleaning water of the assembly process.

Preferably, the chemical composition may be mixed into the cleaning DI water, at a concentration in the cleaning water of 0.1 to 1%, preferably of 0.25 to 0.5%, preferably of 0.35% (w/v), and applied to the contacts at a temperature of 20 to 60° C., preferably 30 to 50° C., most preferably 40° C. just after the ball attach process. The package is rinsed with pure DI water just after cleaning.

Advantageously, the chemical composition is easily applied, environmentally friendly, resistant up to 200° C. and inexpensive.

Finally, one embodiment refers to a semiconductor package, preferably ball grid array package, having a coating on the electrical contacts, preferably the solder balls, the coating comprising at least one ionic polar surfactant.

Preferably the surfactant of the coating is chosen in the group comprising alkyl sulphonates, alkyl phosphonates and N-trimethylated amino acids, and mixtures thereof, preferably alkyl phosphonates.

Preferably, the surfactant of the chemical composition comprises a hydrophobic carbon chain 5 to 15 carbon atoms long, preferably 7 to 12 carbon atoms long, even more preferably 10 carbon atoms long.

Preferably, the coating on the solder balls is of a thickness of about 1 to 3 molecules of the surfactant. This corresponds to a thickness of 0.005 to 0.1 micrometers.

Preferably, the coating exhibits a concentration of surfactant in the chemical composition of 50 to 95%, preferably 70 to 90%, preferably 80% (w/w). Advantageously, the chemical composition forms a coating on the solder ball that is protective and electrically conductive.

In the following lines, a more detailed description of the method for the assembly of the BGA package according to one embodiment is given.

EXAMPLE 1

BGA Assembly Process Comprising the Cleaning Step.

A cleaning test was carried out with a BGA assembly.

Cleaning of the assembled substrate was carried out at the Rix cleaning station, which consists of two adjacent units: the cleaning and the rinsing stages.

The alloy composition of the lead-free solder balls upon which the tests were conducted was Sn(96.5%)Ag(3.5%).

First, the cleaning was carried out. A 0.5% dodecyl phosphonic acid in de-ionized (DI) water was added to the cleaning tank in the cleaning unit. DI water was directed on the frame via high-pressure jets with a pressure setting of 2 bar, a pH of 4 and at a temperature of 50° C. The used water was then mechanically filtered to remove flux residues and other foreign particles.

At the rinsing step, the product was given a final rinse with fresh DI water with the above temperature and pressure settings.

The addition of dodecyl phosphonic acid in DI water on a once per shift basis was found to give consistent results in the outcome of first pass yield in testing due to improved conduction between electrical testing sockets and solder balls.

The electrical yield was improved even after multiple testing at cold, ambient and hot temperatures, when compared to a direct control, all other parameters being constant.

By applying the method described above, the need for electrical recycling, in order to recover failing devices, was greatly reduced. Less recycling was needed and therefore the risk of experiencing product mixing was reduced.

Better cycle times also resulted from the method, as well as higher quality products because of the smoother finish, reduced oxide formation and less handling.

Overall, the method contributed to a significant cost reduction.

It was observed that the organic film of coating formed at the cleaning stage was not washed away when the parts were passed through the subsequent rinsing stage, due to its strong adherence to the tin-rich alloy surface and also due to the simultaneous water repelling nature of the molecule.

As a result, the semiconductor devices treated as described above were found to be more resistant to external chemical factors such as humidity, temperature and contamination, which can insulate the surface, hindering both electrical conduction and eventual soldering.

An advantage is that the ionic or polar part makes it also completely miscible with water, consequently leaving no precipitates in the cleaning tank that could obstruct the mechanical filtration system or contaminate the BGA system.

The method is thus a simple, cheap and reliable method of treatment of the electrical contacts of a semiconductor package for improving yield performance at electrical testing of the semiconductor package, in particular in the case of BGA packages.

The method is of a great advantage for electrical chip testing particularly in the case of lead-free alloy BGA balls. This application, however, can also easily be applied to lead frame-based ICs improving the conduction between the test sockets and IC leads.

Also, the chemical composition used in the method is non-hazardous and is in accordance with the latest ST environmental requirements.

Finally, the application of this organic chemical on lead-free BGA balls is fully compatible with the soldering process at the customer.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising: electrical contacts each coated with a coating, said coating including an ionic surfactant, the ionic surfactant having:
   a non-polar hydrophobic group; and
   an inorganic hydrophilic group.

2. The semiconductor package according to claim 1 wherein said semiconductor package is a ball grid array package (BGA) and said electrical contacts are solder balls.

3. The semiconductor package according to claim 1 wherein said surfactant of the coating is chosen in the group comprising alkyl sulphonates, alkyl phosphonates and N-trimethylated amino acids, and mixtures thereof.

4. The semiconductor package according to claim 3 wherein said surfactant is alkyl phosphonates.

5. The semiconductor package according to claim 1 wherein said surfactant of said chemical composition comprises a hydrophobic carbon chain 5 to 15 carbon atoms long.

6. The semiconductor package according to claim 1 wherein said coating has a thickness of about 1 to 3 molecules of said surfactant.

7. The semiconductor package according to claim 6 wherein said coating has a thickness of 0.005 to 0.1 micrometers.

8. The semiconductor package according to claim 1 wherein said coating has a concentration of surfactant in the coating of 50 to 95% by weight.

9. A method, comprising:
   assembling a semiconductor package that includes electrical contacts; and
   coating each of the electrical contacts with a chemical composition that includes an ionic surfactant, the ionic surfactant having:
   a non-polar hydrophobic group; and
   an inorganic hydrophilic group.

10. The method according to claim 9 wherein said chemical composition has a pH of 6 or below.

11. The method according to claim 9 wherein said chemical composition further includes a pH stabilizer.

12. The method according to claim 9 wherein said semiconductor package is a ball grid array (BGA) package and said electrical contacts are solder balls.

13. The method according to claim 9 wherein said surfactant of the chemical composition is chosen in the group consisting of: alkyl sulphonates, alkyl phosphonates and N-trimethylated amino acids, and mixtures thereof.

14. The method according to claim 13 wherein said surfactant is an alkyl phosphonate.

15. The method according to claim 9 wherein said surfactant of the chemical composition comprises a hydrophobic carbon chain 5 to 15 carbon atoms long.

16. The method according to claim 9 wherein the applying includes forming a coating on the electrical contacts of a thickness of about 1 to 3 molecules of said surfactant.

17. The method according to claim 16 wherein said coating has a thickness of 0.005 to 0.1 micrometers.

18. The method according to claim 9 wherein the applying includes forming a coating of the chemical composition wherein a concentration of the surfactant in the chemical composition is 50 to 95 per cent by weight.

19. The method according to claim 9 wherein said assembling includes cleaning the semiconductor package and the applying is performing during the cleaning.

20. The method according to claim 19 wherein said cleaning includes cleaning with a water mixture that includes the chemical composition at a concentration in the cleaning water of 0.1 to 1 and at a temperature of 20 to 60° C.

21. The method according to claim 9 further comprising attaching the semiconductor package to a printed circuit board and electrically coupling the treated electrical contacts of the semiconductor package to corresponding electrical contacts of the printed circuit board.

22. The method according to claim 21 wherein the electrical contacts of the semiconductor package are solder balls that contact corresponding metal pads of the semiconductor package, and electrically coupling the treated electrical contacts of the semiconductor package to corresponding electrical contacts of the printed circuit board includes reflowing the solder balls into a solder bond between the metal pads of the semiconductor package and the electrical contacts of the printed circuit board.

* * * * *

UNITED STATES PATENT AND TRADEMARK OFFICE
CERTIFICATE OF CORRECTION

| | | |
|---|---|---|
| PATENT NO. | : 8,618,676 B2 | Page 1 of 1 |
| APPLICATION NO. | : 12/261841 | |
| DATED | : December 31, 2013 | |
| INVENTOR(S) | : Robert Caruana et al. | |

It is certified that error appears in the above-identified patent and that said Letters Patent is hereby corrected as shown below:

In the Claims:

Column 12, Line 2:
"of 0.1 to 1and at a temperature of 20 to 60° C." should read, --of 0.1 to 1 and at a temperature of 20 to 60°C.--.

Signed and Sealed this
Tenth Day of June, 2014

Michelle K. Lee
*Deputy Director of the United States Patent and Trademark Office*